(12) United States Patent
Hill

(10) Patent No.: US 6,491,404 B2
(45) Date of Patent: Dec. 10, 2002

(54) MICROELECTROMECHANICAL APPARATUS WITH TILTABLE BODIES INCLUDING VARIABLE TILT-STOP ENGAGING PORTIONS AND METHODS OF OPERATION AND FABRICATION THEREFOR

(75) Inventor: Edward A. Hill, Chapel Hill, NC (US)

(73) Assignee: JDS Uniphase Corporation, Research Triangle Park, NC (US)

( * ) Notice: Subject to any disclaimer, the term of this patent is extended or adjusted under 35 U.S.C. 154(b) by 0 days.

(21) Appl. No.: 09/860,855

(22) Filed: May 18, 2001

(65) Prior Publication Data

US 2002/0118472 A1 Aug. 29, 2002

Related U.S. Application Data
(60) Provisional application No. 60/271,151, filed on Feb. 23, 2001.

(51) Int. Cl.$^7$ ............................................. G02B 7/182
(52) U.S. Cl. ...................... 359/872; 359/871; 359/296; 359/298; 359/233
(58) Field of Search ................................ 359/872, 871, 359/296, 298, 233, 198, 223, 224

(56) References Cited

U.S. PATENT DOCUMENTS

| | | | | |
|---|---|---|---|---|
| 5,867,297 A | * | 2/1999 | Kiang et al. | 235/462.32 |
| 5,914,801 A | | 6/1999 | Dhuler et al. | 359/230 |
| 5,920,417 A | | 7/1999 | Johnson | 359/223 |
| 6,020,272 A | | 1/2000 | Fleming | 438/734 |
| 6,040,935 A | * | 3/2000 | Michalicek | 359/198 |
| 6,087,747 A | | 7/2000 | Dhuler et al. | 310/90 |
| 6,134,042 A | | 10/2000 | Dhuler et al. | 359/224 |
| 6,181,460 B1 | | 1/2001 | Tran et al. | 359/291 |
| 6,186,399 B1 | | 2/2001 | Stern et al. | 235/462.01 |
| 6,201,629 B1 | | 3/2001 | McClelland et al. | 359/223 |

OTHER PUBLICATIONS

An et al., "Two–Input Axis Angular Rate Sensor," Part of the SPIE Conference on Smart Electronics and MEMS, SPIE vol. 3673, Mar. 1999, pp. 218–229.

Kim et al., "Fabrication and Deflection Measurement of Micromirrors Supported by a S–shape Girder," Part of the SPIE Conference on Diffractive and Holographic Technologies, Systems, and Spatial Light Modulators VI, SPIE vol. 3633, Jan. 1999, pp. 138–147.

Wu et al., "Micromechanical Photonic Integrated Circuits," IEICE Trans Electron, vol. E83–C, No. 6, Jun. 2000, pp. 903–911.

* cited by examiner

*Primary Examiner*—Mohammad Sikder
(74) *Attorney, Agent, or Firm*—Myers Bigel Sibley & Sajovec

(57) ABSTRACT

A micromechanical apparatus includes a microelectronic substrate and a tiltable body thereon. The tiltable body includes a plate configured to tilt about an axis parallel to the microelectronic substrate and a tilt stop engaging portion disposed axially adjacent the plate. A range of rotation of the plate about the axis is defined by contact of the tilt stop engaging portion with a tilt stop on the substrate. The microelectronic substrate may have an opening therein configured to receive the plate, and the tilt stop may include a surface of the microelectronic substrate adjacent the opening. An actuator, such as an electrostatic actuator, may tilt the tiltable body about the axis. Related operation and fabrication methods are also described.

22 Claims, 6 Drawing Sheets

MICROELECTROMECHANICAL APPARATUS WITH TILTABLE BODIES INCLUDING VARIABLE TILT-STOP ENGAGING PORTIONS AND METHODS OF OPERATION AND FABRICATION THEREFOR

RELATED APPLICATION

This application claims the benefit of U.S. Provisional Application No. 60/271,151 filed Feb. 23, 2001, the disclosure of which is hereby incorporated herein by reference.

FIELD OF THE INVENTION

This invention relates to micromechanical apparatus, and more specifically, to moveable microstructures for use in optical and other microelectromechanical systems (MEMS).

BACKGROUND OF THE INVENTION

Microelectromechanical systems (MEMS) have been developed as alternatives to conventional electromechanical devices. MEMS devices are potentially low-cost devices, due to the use of microelectronic fabrication techniques. New functionality also may be provided, because MEMS devices can be much smaller than conventional electromechanical devices.

A common application of MEMS technology is in the fabrication of moveable mirrors and other optical devices. For example, MEMS techniques have been used to fabricate moveable micromirrors for use in directing light in devices such as bar code scanners, optical switches and projection video displays. Examples of MEMS micromirror structures are described in U.S. Pat. No. 6,186,399 to Stern et al., U.S. Pat. No. 6,201,629 to McClelland et al., U.S. Pat. No. 6,181,460 to Tran et al., and U.S. Pat. No. 6,134,042 to Dhuler et al.

Many conventional micromirror structures include a body that bears a mirror surface and that is suspended above a substrate by a "hinge" that provides rotation of the mirror surface about an axis. Arrays of such structures may be used in devices such as optical switches or video display devices. In many applications, it may be desirable to fabricate multiple mirrors with differing sizes and deflection angles on a single substrate.

SUMMARY OF THE INVENTION

According to embodiments of the present invention, an apparatus includes a microelectronic substrate and a tiltable body thereon. The tiltable body includes a plate configured to tilt about an axis and a tilt stop engaging portion axially displaced with respect to the plate. A range of rotation of the plate about the axis is defined by contact of the tilt stop engaging portion with a tilt stop on the substrate.

In some embodiments of the present invention, the microelectronic substrate has an opening therein configured to receive the plate, and the tilt stop comprises a surface of the microelectronic substrate adjacent the opening. In other embodiments of the present invention, the tiltable body is attached to the microelectronic substrate by first and second spaced apart supports. The tiltable body may include first and second beams attached to respective ones of the first and second spaced-apart supports. An optical device region, such as a mirror, a lens, a filter, a refractive or other optical coating, a prism, or an optical source, may be disposed on the plate. The apparatus may further include an actuator, such as an electrostatic actuator, that is operative to move the tiltable body about the axis.

In method embodiments of the present invention, a micromechanical device may be fabricated by forming a tiltable body on a microelectronic substrate, the tiltable body including a plate configured to tilt about an axis and a tilt stop engaging portion axially displaced with respect to the plate. A range of rotation of the plate about the axis is defined by contact of the tilt stop engaging portion with a tilt stop on the substrate. The range of rotation may be controlled by controlling the extent of the tilt stop engaging portion.

DETAILED DESCRIPTION

Figure 1:
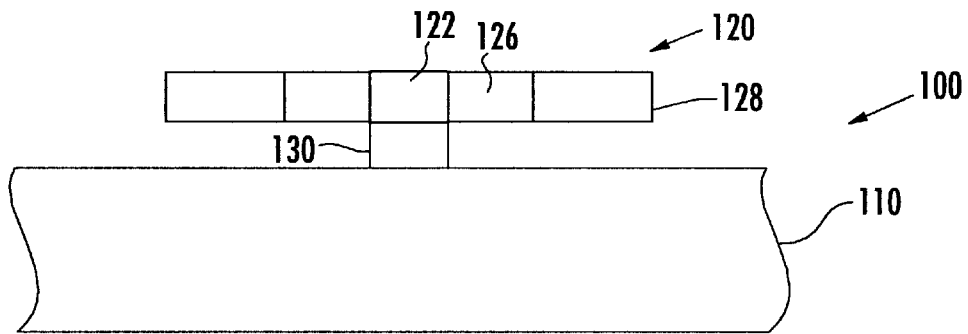
FIG. 1 is a side view of a micromechanical apparatus according to embodiments of the present invention.
Figure 2:
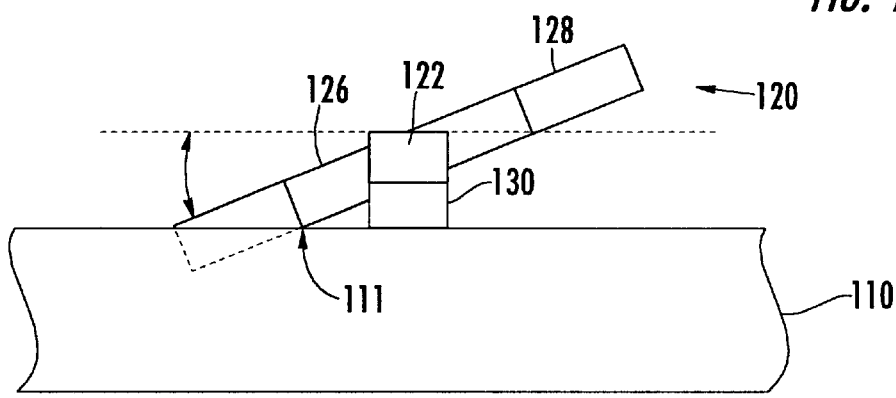
FIG. 2 is side view of the micromechanical apparatus of FIG. 1 in a tilted position.
Figure 3:
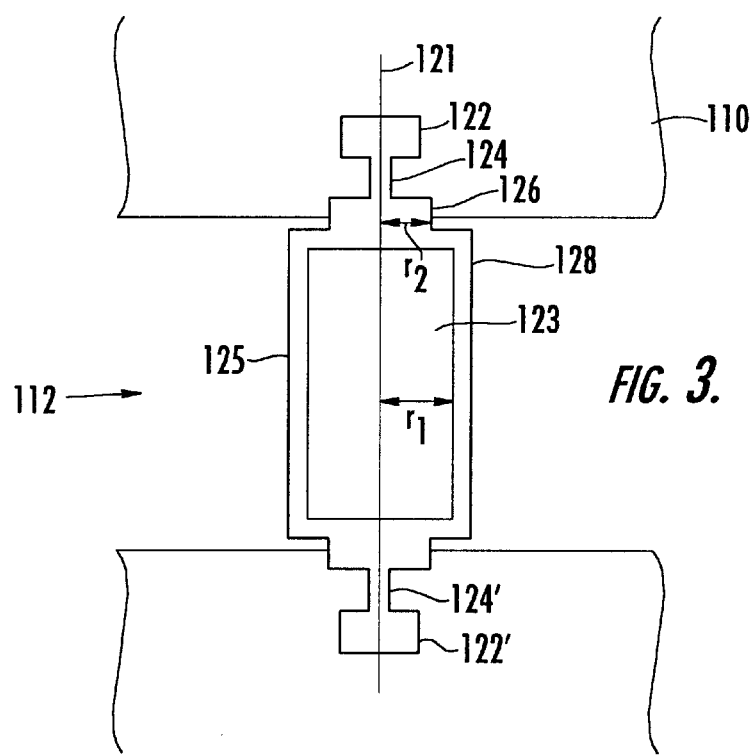
FIG. 3 is a top view of the micromechanical apparatus of FIG. 1.
Figure 4:
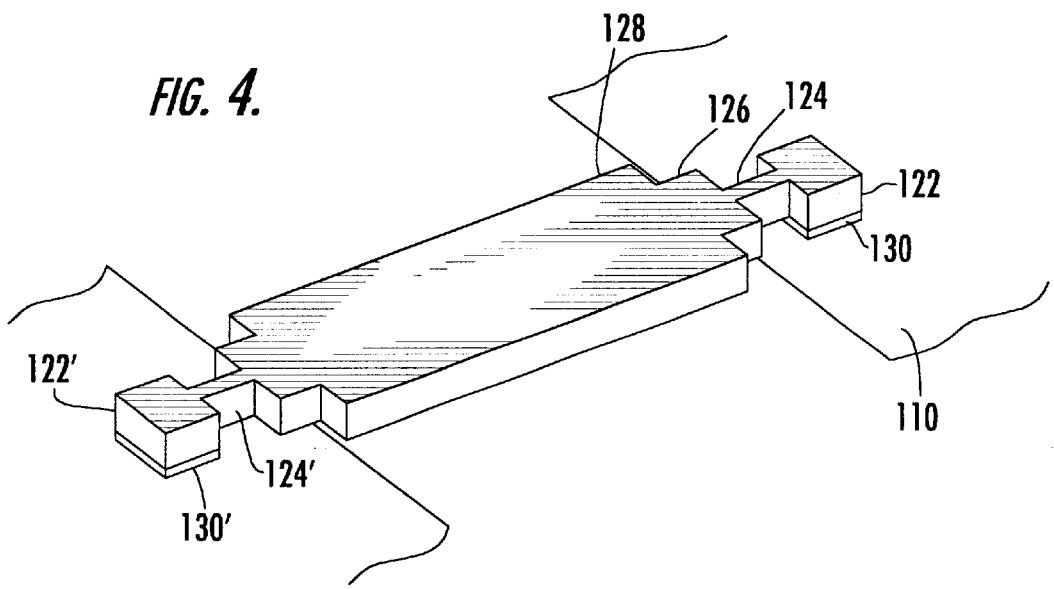
FIG. 4 is a perspective view of the micromechanical apparatus of FIG. 1.
Figure 5:
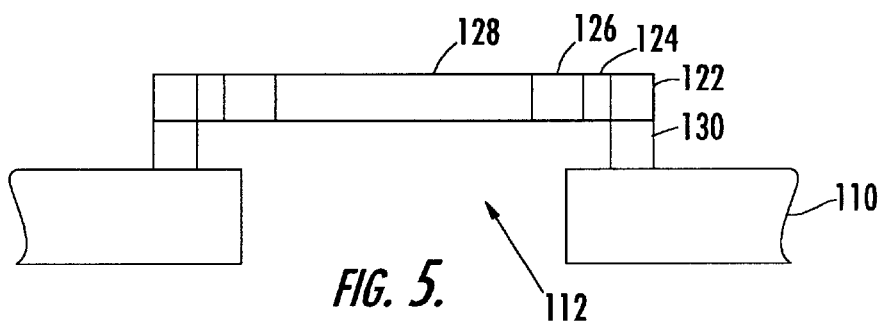
FIG. 5 is a front view of the micromechanical apparatus of FIG. 1.

The present invention now will be described more fully hereinafter with reference to the accompanying drawings, in which embodiments of the invention are shown. This invention may, however, be embodied in many different forms and should not be construed as limited to these embodiments; rather, these embodiments are provided so that this disclosure will be thorough and complete, and will fully convey the scope of the invention to those skilled in the art. In the drawings, thicknesses, displacements and other features may be exaggerated for clarity. Like numbers refer to like elements throughout. It will be understood that when an element such as a layer, region or substrate is referred to as being "on", "connected to" or "coupled to" another element, it can be directly on, directly connected to or directly coupled to the other element, or intervening elements also may be present.

FIGS. 1–5 illustrate a micromechanical apparatus 100 according to embodiments of the present invention. The apparatus 100 includes a tiltable body 120 that is operative to tilt about an axis 121 substantially parallel to a substrate 110. The tiltable body 120 is attached to the substrate 100 by spaced-apart supports 130, 130'. In particular, the tiltable body 120 includes first and second pad regions 122, 122' that are fixedly attached to the supports 130, 130'. Flexible beams 124, 124' attach the pad regions 122, 122' to a medial portion 125 of the body 120. The flexible beams 124, 124' are configured to twist about the axis 121 to allow the tiltable body 120 to rotate.

The tiltable body 120 includes a plate 128 that extends a first radial distance r1 from the axis 121, and a tilt stop engaging portion 126 that is axially displaced with respect to the plate 128 and that extends a second, lesser radial distance r2 from the axis 121. As shown, the plate 128 comprises a region 123, which region 123 may comprise, for example, an optical device region, such as a mirror, lens, filter, refractive or other optical coating, prism, light emitting diode, laser or other optical source. Tilting of the body 120 causes the region 123 to also tilt about the axis 121.

The angular range over which the body 120 tilts is defined by contact of the tilt stop engaging portion 126 with a tilt stop 111, here shown as a surface of the substrate 110 adjacent an opening 112 in the substrate 110. The opening 112 is configured to receive the plate 128 as the tilt stop engaging portion 126 approaches the tilt stop 111. As shown, the opening 112 extends through the substrate 110, but it will be appreciated that the opening 112 may be configured such that it extends only partially into the substrate 110. It will be understood that an opening need not be provided if, for example, the tilt stop 111 is elevated above the substrate 110 and the supports 130, 130' provide sufficient clearance for the plate 128.

A potential advantage of providing the tilt-stop engaging portion 126 is that the angular range may be controlled by controlling the extent of the tilt-stop engaging portion 126, independent of the extent of the portion 128 that bears the region 123. This may be particularly advantageous in forming a microelectromechanical device including several such tiltable bodies that include optical device regions of different sizes and/or different angular range requirements.

Figure 6:
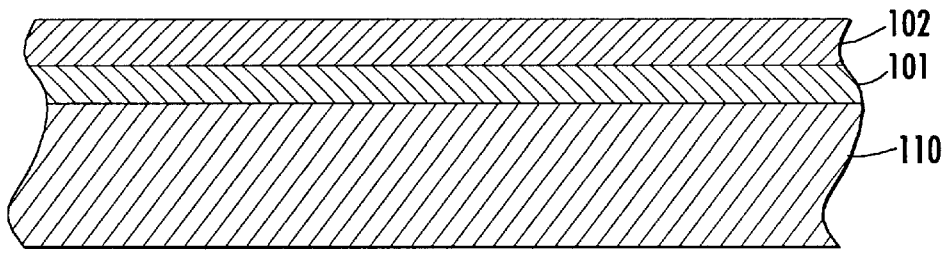
FIGS. 6–8 are cross-sectional views of fabrication products illustrating operations for fabricating a micromechanical apparatus according to embodiments of the present invention.
Figure 7:
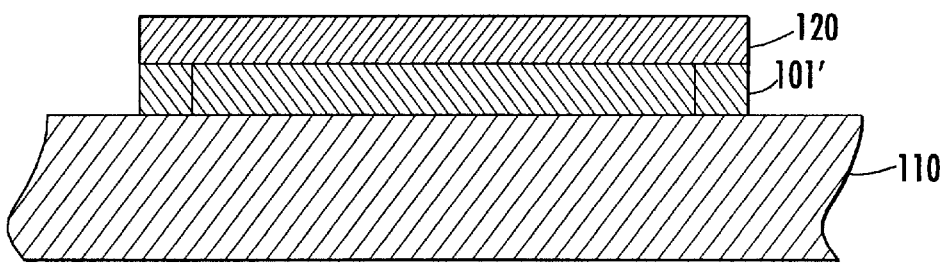
Figure 8:
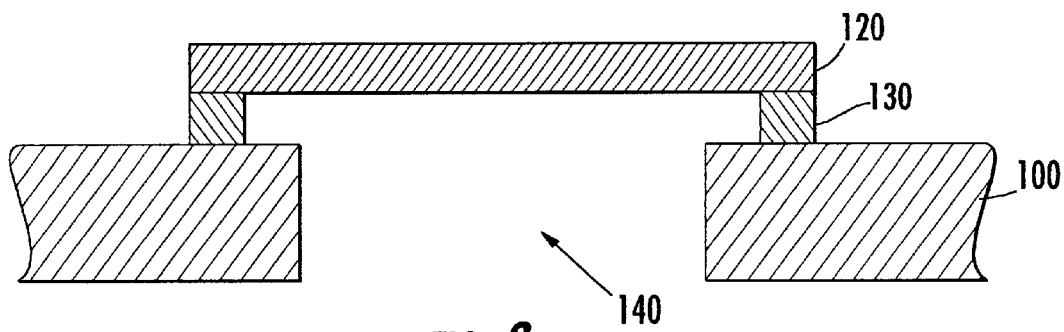
Figure 9:
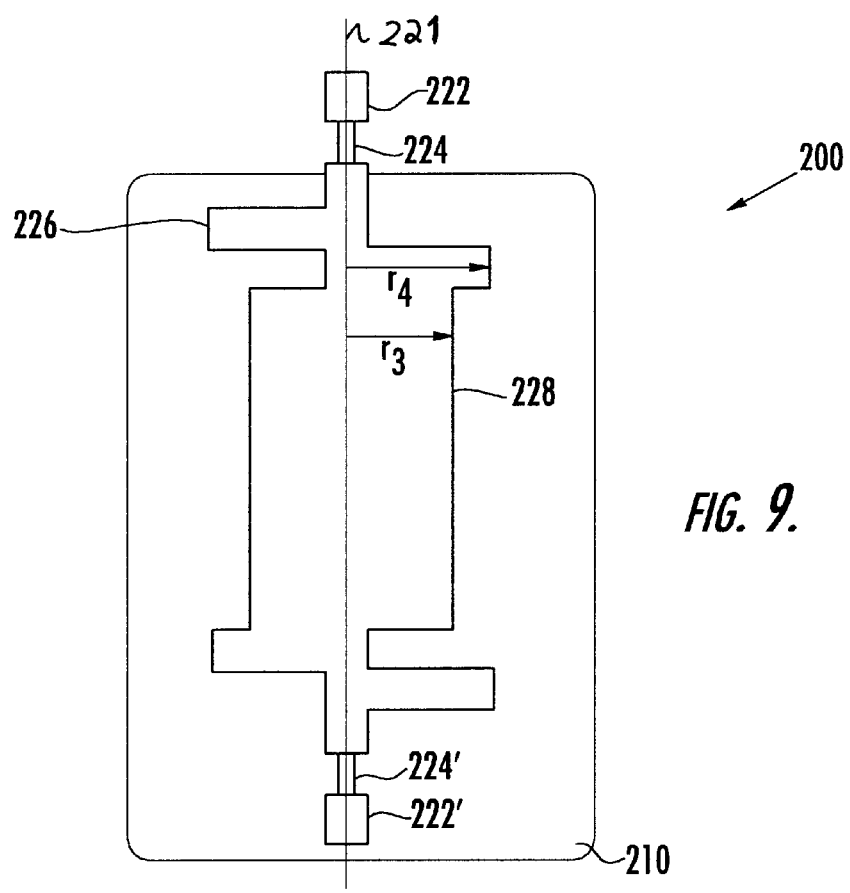
FIG. 9 is a top view of a micromechanical apparatus according to other embodiments of the present invention.
Figure 10:
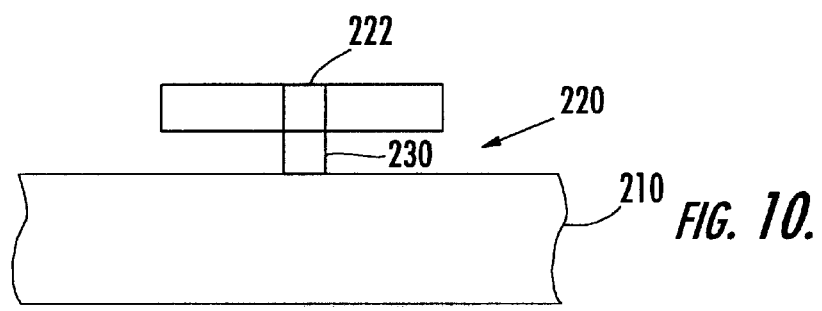
FIG. 10 is a side view of the micromechanical apparatus of FIG. 9.
Figure 11:
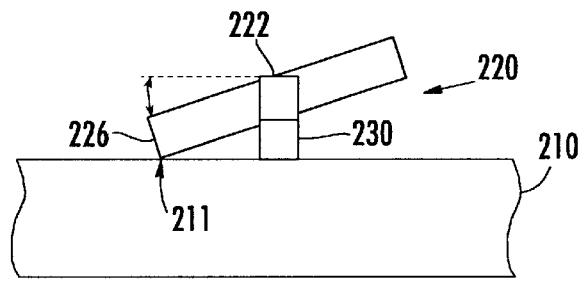
FIG. 11 is a side view of the micromechanical apparatus of FIG. 9 in a tilted position.
Figure 12:
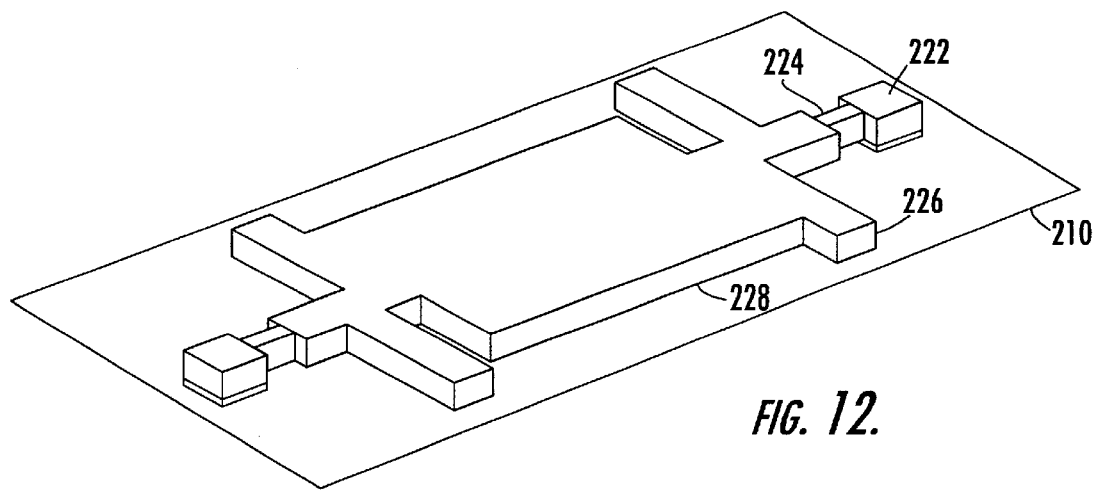
FIG. 12 is a perspective view of the micromechanical apparatus of FIG. 9.

FIGS. 6–8 are cross sectional views along the axis 121 of fabrication products produced in fabricating the apparatus 100 of FIGS. 1–5 according to embodiments of the present invention. Referring to FIG. 6, a silicon-on-insulator structure is fabricated, including a silicon substrate 110, a sacrificial silicon dioxide layer 101, and a silicon layer 102. As shown in FIG. 7, the silicon layer 102 and the sacrificial layer 101 are patterned to form the tiltable body 120. As shown in FIG. 8, portions of the sacrificial layer 101 are then removed to release a portion of the tiltable body 120 from the substrate 110, in particular, by a dry back-etching process that also forms the opening 112 through the substrate 110. Such patterning and etching processes are known to those skilled in the art and will not be discussed in further detail herein.

It will appreciated that a wide variety of materials and fabrication processes may be used with the present invention, including, but not limited to, bulk micromachining processes, surface micromachining processes, and high aspect ratio micromachining processes such as LIGA processes. LIGA and other conventional micromachining processes are known to those skilled in the art. Exemplary micromachining processes are described in *MUMPs™ Design Handbook*, Rev. 5.0, published by Cronos Integrated Microsystems (2000).

Formation of an optical device region on the body 120 may comprise a variety of different operations. For example, a mirror may be formed by forming a reflective layer, such as a gold layer, on the silicon layer 102 prior to or after patterning thereof. Formation of other types of device regions, such as lenses, optical coatings, filters, prisms and active microelectronic device regions comprising LEDs or laser diodes, may involve additional fabrication operations. Such operations are known to those skilled in the art, and will not be discussed in detailed herein.

It will be appreciated that the present invention is not limited to the configuration illustrated in FIGS. 1–5. For example, although the tiltable body 120 is shown as attached to the substrate 110 at first and second supports 130, 130', it will be understood that fewer or more supports may be provided, and that these supports may have different configurations from that illustrated in FIGS. 1–5. For example, rather than utilizing a flexural pivot as illustrated in FIGS. 1–5, a tiltable body according to embodiments of the present invention may utilize a bearing or other type of pivot arrangement.

A tiltable body according to the present invention may also have a different shape than illustrated in FIGS. 1–5. For example, the plate 128 may have a circular, elliptical or irregular outline, rather than the rectilinear outline illustrated in FIGS. 1–5. In addition, the plate 128 and/or the region 123 thereon may have any of a variety of different profiles, including straight, concave, convex or irregular profiles. The tilt stop engaging portion 126 may also have a different configuration than that illustrated in FIGS. 1–5. Although FIGS. 1–5 show a tilt engaging portion 126 immediately adjacent the plate 128, it will be appreciated that the plate 128 and the tilt-stop engaging portion 126 may be separated from the plate 128 by an intervening structure, such as a beam. Also, the axis 121 need not be parallel to the substrate 110. For example, the axis 121 may be oblique or even orthogonal to the substrate 110.

Although FIGS. 1–5 illustrate a tiltable body 120 that is operative to tilt in a symmetrical fashion about the axis 121, asymmetrical structures that are operative to tilt through asymmetrical ranges also fall within the scope of the present invention. Such devices with asymmetrical ranges may be formed, for example, by using tilt-stop engaging portions 126 of non-uniform extent, e.g., that extend different distances from the axis 121 on respective sides of the axis 121. In addition, FIGS. 1–5 illustrate a tilt stop 111 that comprises a surface of a substrate 110 adjacent an opening 112 in the substrate 110, a tilt stop may be configured in other ways within the scope of the present invention. For example, a tilt stop may comprise a surface of structure built up on the substrate 110.

It will be further appreciated that the fabrication operations of FIGS. 6–8 may also be modified within the scope of the present invention. For example, instead of the above-described back-etching technique, front side etching operations may be used to form the opening 112 and to release the body 120. Formation of different types of pivot and/or tilt stop arrangements than those illustrated in FIGS. 1–5 may entail formation and patterning of additional layers. In addition, materials other than the silicon on insulator structure described with reference to FIGS. 6–8 may be used with the present invention. For example, the layer used to form the tiltable body 120 may comprise a material other than silicon, including a metal such as aluminum, nickel, copper or gold, or a metal alloy such as a nickel-phosphorus alloy.

According to other embodiments of the present invention illustrated in FIGS. 9–12, a micromechanical apparatus 200 includes a tiltable body 220 that is operative to tilt about an axis 221 substantially parallel to a substrate 210 through an angular range. The tiltable body 220 is attached to the substrate 210 by spaced-apart supports 230, 230'. The tiltable body 220 includes first and second pad regions 222, 222' that are fixedly attached to the supports 230, 230'. Flexible beams 224, 224' extend between the pad regions 222, 222' to a medial portion 225 of the body 220. The flexible beams 224, 224' are configured to twist about the axis 221 to allow the tiltable body 220 to tilt.

The tiltable body 220 includes a plate 228 that extends a first radial distance r3 from the axis 221, and tilt stop engaging portion 226 that is axially displaced with respect to the plate 228 and that extends a second, greater radial distance r4 from the axis 221. As shown, the plate 228 comprises a region 223, which region 223 may comprise, for example, an optical device region, such as a mirror, prism, lens, light emitting diode, laser or other optical source. Tilting action of the body 220 causes the region to tilt about the axis 221. The angular range through which the body 220 tilts is defined by contact of the tilt stop engaging portion 226 of the body 220 with a tilt stop 211, here shown as a surface of the substrate 210. As with the embodiments illustrated in FIGS. 1–5, the angular range may be controlled by controlling the extent of the tilt-stop engaging portion 226, independent of the extent of the portion 228 that bears the working surface 223.

It will be appreciated that the present invention is not limited to the configuration illustrated in FIGS. 9–12. For example, although the tiltable body 220 is shown as attached to the substrate 210 at first and second supports 230, 230', it will be understood that fewer or more supports may be provided, and that these supports may have different configurations from that illustrated in FIGS. 9–12. For example, rather than utilizing a flexural pivot as illustrated in FIGS. 9–12, a tiltable body according to embodiments of the present invention may utilize a bearing or other type of pivot arrangement.

A tiltable body may also have a different shape than illustrated in FIGS. 9–12. For example, the first body portion 228 may have a circular, elliptical or irregular outline, rather than the rectilinear outline illustrated in FIGS. 9–12. In addition, the plate 228 and/or the region 223 thereon may, in general, have any of a variety of different profiles, including straight, concave, convex or irregular profiles. The tilt stop engaging portion 226, shown in FIGS. 9–12 as an elongate member extending from the axis 221, may have a different configuration than that illustrated in FIGS. 9–12. Although FIGS. 9–12 show a tilt engaging portion 226 immediately adjacent the plate 228, it will be appreciated that the plate 228 and the tilt-stop engaging portion 226 may be separated from the plate 228 by an intervening structure, such as a beam.

Although FIGS. 9–12 illustrate a tiltable body 220 that is operative to tilt in a symmetrical fashion about the axis 221, asymmetrical structures that are operative to tilt through asymmetrical ranges also fall within the scope of the present invention, along lines discussed above with reference to FIGS. 1–5. In addition, although FIGS. 9–12 illustrate a tilt stop 211 that comprises a surface of the substrate 210, a tilt stop may be provided in other ways within the scope of the present invention. For example, a tilt stop may comprise a surface of structure built up on the substrate 210.

It will be appreciated that the apparatus 200 of FIGS. 9–12 may be fabricated using many of the operations and/or materials described above with reference to FIGS. 6–8. It may be noted that, because it may not be necessary to form an opening to receive the plate 228, operations for forming such a feature may not be required. It will be further appreciated that the present invention is not limited to the aforementioned fabrication techniques and/or materials.

Figure 13:
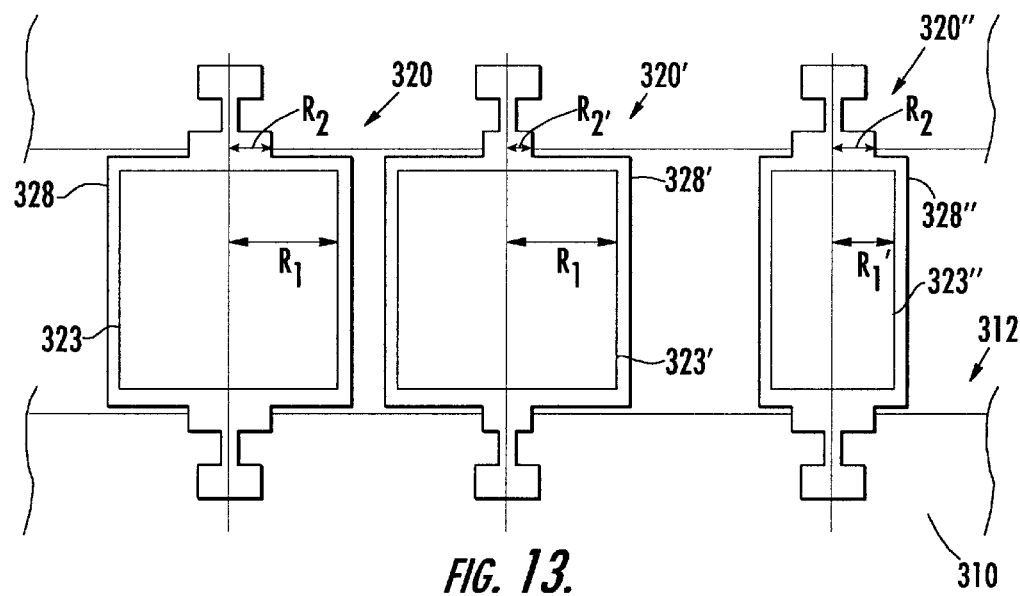
FIG. 13 is a top view of an array of microelectromechanical apparati according to embodiments of the present invention.

FIG. 13 illustrates a plurality of micromechanical apparati 300, 300', 300" that includes respective plurality of tiltable bodies 320, 320', 320" according to embodiments of the present invention. In particular, the three apparati 300, 300', 300" have the same general configuration as the apparatus 100 of FIGS. 1–5, i.e., each includes a plate 328, 328', 328" that includes a working, e.g., optical device, region 323, 323', 323", and a tilt stop engaging portion 326, 326', 326" configured to engage a tilt stop surface adjacent an opening 312 in a substrate 310. As shown, working regions 323, 323' of a first pair 320, 320' of the bodies have the same radial extent R1, but are provided with different angular ranges by having respective size tilt stop engaging portions 326, 326' with different radial extents R2, R2'. A second pair of the bodies 320, 320" comprises working regions 323, 323" with different radial extents R1, R1', but have the same angular range due to having tilt stop engaging portions 326, 326" having the same radial extent R2.

Figure 14:
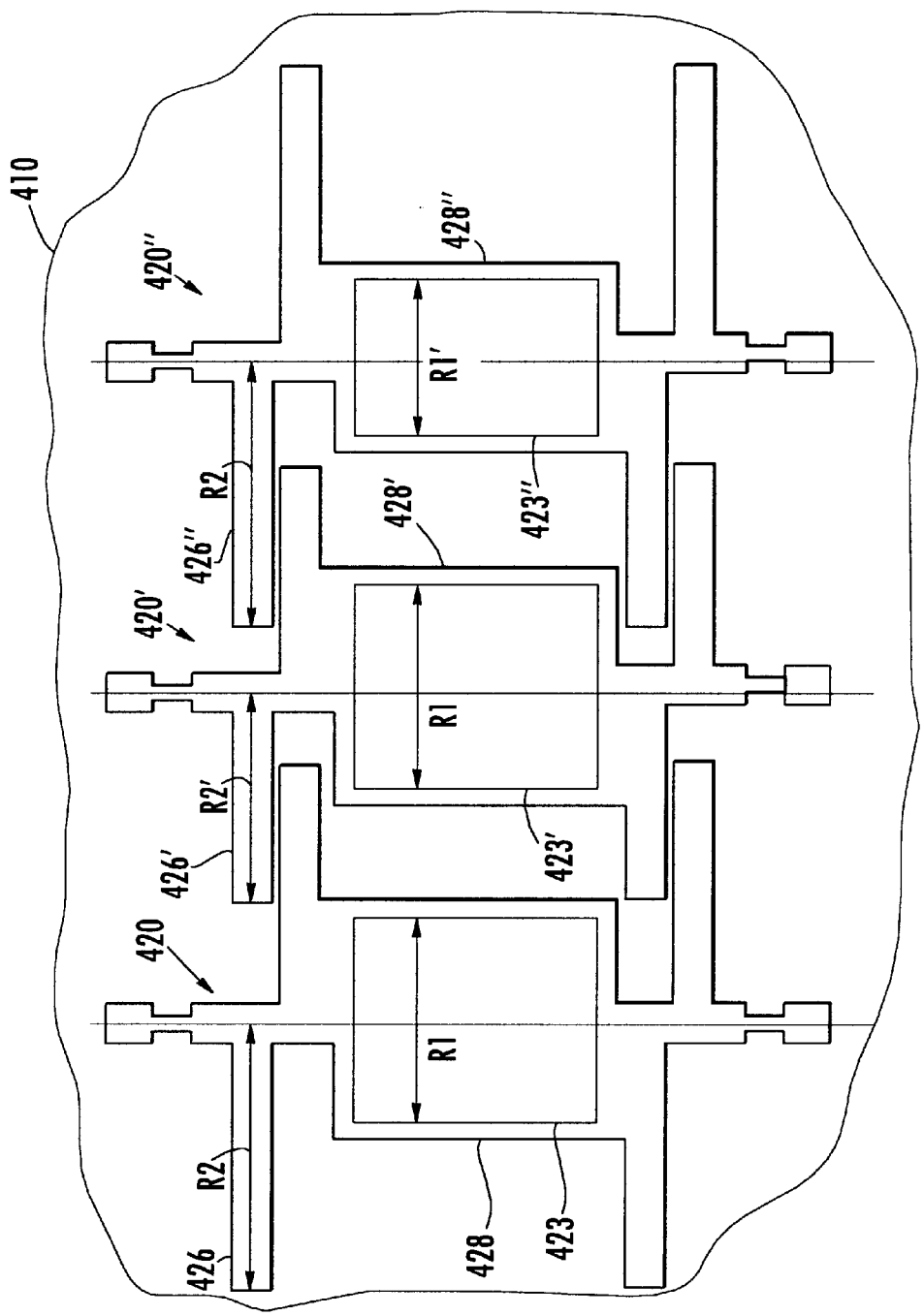
FIG. 14 is top view of an array of microelectromechanical apparati according to other embodiments of the present invention.

FIG. 14 illustrates a plurality of micromechanical apparati 400, 400', 400" that have the same general configuration as the apparatus 200 illustrated in FIGS. 9–12. The respective apparati 400, 400', 400" include respective tiltable bodies 420, 420', 420", each of which includes a plate 428, 428', 428" that bears a working, e.g., optical device, region 423, 423', 423", and a tilt stop engaging portion 426, 426', 426" configured to engage a tilt stop surface adjacent an opening 412 in a substrate 410. As shown, working regions 423, 423' of a first pair 420, 420' of the bodies have the same radial extent R1, but are provided with different angular ranges by having respective size tilt-stop engaging portions 426, 426' with different extents R2, R2'. A second pair 420, 420" of the bodies comprise working regions 423, 423" with different radial extents R1, R1', but have the same angular range due to having tilt stop engaging portions 426, 426" having the same radial extent R2.

It is apparent from the illustrated embodiments of FIGS. 13 and 14 that the present invention can provide a capability to control angular range of tiltable bodies, such as bodies that bear mirrors, lenses, prisms, optical sources, or other optical devices, independent of the extent of these devices. It will be appreciated that, within a micromechanical device, the configurations of FIGS. 13 and 14 can be combined. It will be further appreciated that the configurations of the various tiltable bodies can also be varied as described, for example, in the foregoing description of FIGS. 1–12.

Figure 15:
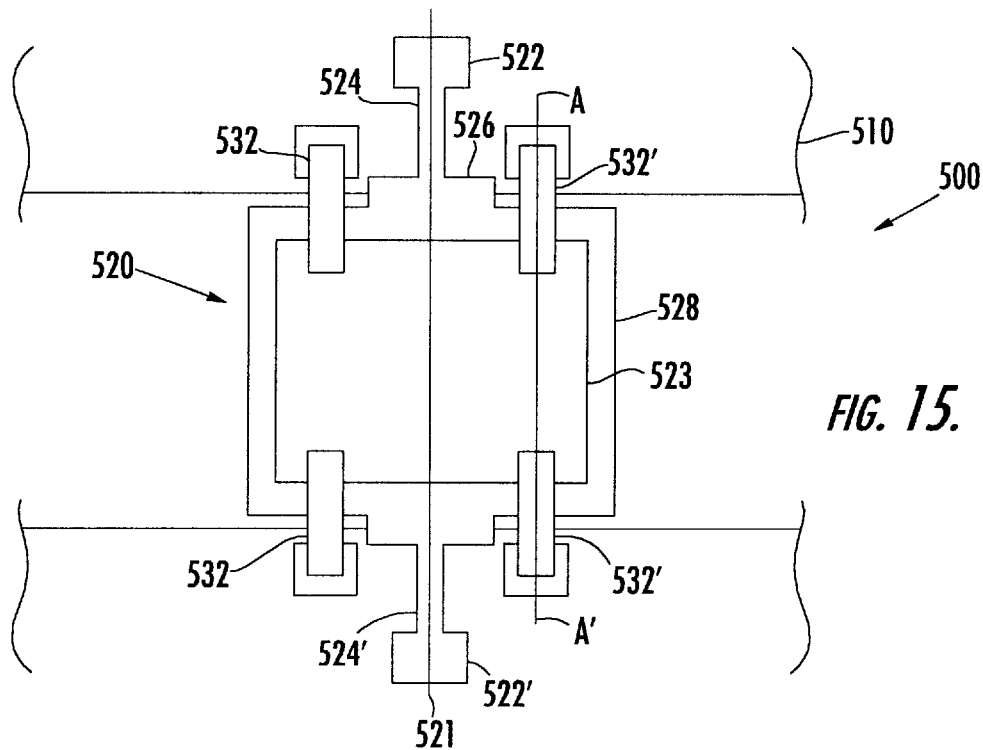
FIG. 15 is a top view of a microelectromechanical apparatus according to embodiments of the present invention.
Figure 16:
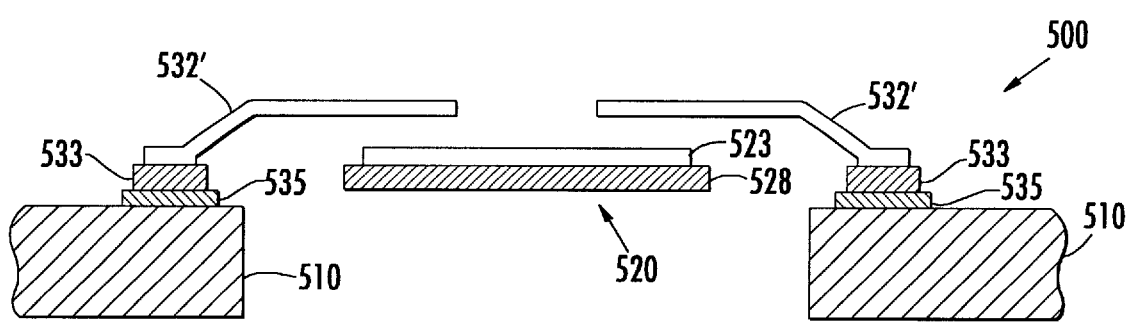
FIG. 16 is a cross-sectional view of the microelectromechanical apparatus of FIG. 15.

FIGS. 15 and 16 illustrate a microelectromechanical device 500 according to other embodiments of the present invention. In particular, the device 500 includes a tiltable body 520 that is operative to tilt about an axis 521 substantially parallel to a substrate 510. The tiltable body 520 includes first and second pad regions 522, 522' that are fixedly attached to the substrate 510 in a manner as described above with reference to FIGS. 1–5. Flexible portions 524, 524' attach the pad regions 522, 522' to a medial portion 525 of the body 520 including a plate 528 and a tilt stop engaging portion 526 axially displaced from the plate 528. The flexible portions 524, 524' are configured to twist about the axis 521 to allow the tiltable body 520 to rotate through an angle constrained by contact of the tilt-stop engaging portion 526 with the substrate 510. As shown, an optical device region, in particular, a mirror 523, is formed on the tiltable body 520.

An actuator for driving the tiltable body 520 about the axis 521 includes right and left side electrodes 532, 532' that are attached to the substrate 510 and that extend over portions of the plate 528. As shown in FIG. 16, which illustrates the structure of FIG. 15 in cross-section along a line AA' extending through the right side electrodes 532', the electrodes 532' are formed on a structure including a first region 535 formed from a sacrificial layer (portions of which are removed to release the plate 528) and a second region 533 formed from the same material layer as the plate 528. The electrodes 532' and the plate 528 may be formed from a conductive material, such as polysilicon or metal, and may be connected to other structures, such as wiring patterns and active semiconductor devices (not shown), on the substrate 510 that are operative to produce a voltage between the electrodes 532' and the plate 528. This allows an electrostatic force to be applied to the tiltable body 520 to effect rotation of the tiltable body 520. In particular, voltages may be selectively applied to the left and right side electrodes 532, 532' to effect rotation in either direction.

It will be appreciated that the actuator configuration illustrated in FIGS. 15, and 16 is provided for exemplary purposes, and that other actuator configurations including, but not limited to, electromagnetic, piezoelectric, and thermal actuator configurations, may be used with the present invention. For example, the tiltable body 520 may be moved about its axis 521 using an actuator that mechanically engages the tiltable body 520, such as a piezoelectric actuator or thermal arched beam actuator.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. An apparatus, comprising:
   a microelectronic substrate; and
   a tiltable body including a plate configured to tilt about an axis and a tilt stop engaging portion axially displaced along the axis with respect to the plate, wherein a range of rotation of the plate about the axis is defined by contact of the tilt stop engaging portion with a tilt stop on the substrate.

2. The apparatus of claim 1, wherein the axis is arranged substantially parallel to the microelectronic substrate.

3. The apparatus of claim 1, wherein the tilt stop comprises a surface of the microelectronic substrate.

4. An apparatus, comprising:
   a microelectronic substrate; and
   a tiltable body including a plate configured to tilt about an axis and a tilt stop engaging portion axially displaced with respect to the plate, wherein a range of rotation of the plate about the axis is defined by contact of the tilt stop engaging portion with a tilt stop on the substrate,
   wherein the plate extends a first radial distance from the axis; and
   wherein the tilt stop engaging portion extends a second radial distance from the axis that is different from the first distance.

5. An apparatus, comprising:
   a microelectronic substrate; and
   a tiltable body including a plate configured to tilt about an axis and a tilt stop engaging portion axially displaced with respect to the plate, wherein a range of rotation of the plate about the axis is defined by contact of the tilt stop engaging portion with a tilt stop on the substrate,
   wherein the microelectronic substrate has an opening therein configured to receive the plate; and
   wherein the tilt stop comprises a surface of the microelectronic substrate adjacent the opening.

6. The apparatus of claim 5, wherein the opening extends through the microelectronic substrate.

7. The apparatus of claim 4, wherein the tiltable body is attached to the microelectronic substrate by first and second spaced apart supports.

8. The apparatus of claim 7, wherein the tiltable body comprises first and second beams attached to respective ones of the first and second spaced-apart supports.

9. The apparatus of claim 4, further comprising an optical device region on the plate.

10. The apparatus of claim 9, wherein the optical device region comprises at least one of a mirror, a lens, a prism, and an optical source.

11. The apparatus of claim 4, further comprising an actuator operative to tilt the tiltable body about the axis.

12. An apparatus, comprising:
    a microelectronic substrate; and
    a first tiltable body including a first plate configured to tilt about a first axis and a first tilt stop engaging portion axially displaced with respect to the first plate, wherein a first range of rotation of the first plate about the first axis is defined by contact of the first tilt stop engaging portion with a first tilt stop on the substrate; and a second tiltable body including a second plate configured to tilt about a second axis and a second tilt stop engaging portion axially displaced with respect to the second plate, wherein a second range of rotation of the second plate about the second axis is defined by contact of the second tilt stop engaging portion with a second tilt stop on the substrate.

13. The apparatus of claim 12, wherein the first and second plates each have the same radial extent with respect to the respective first and second axes, and wherein the first and second ranges of rotation are different.

14. The apparatus of claim 12, wherein the first and second plates have respective different radial extents with respect to the respective first and second axes, and wherein the first and second ranges of rotation are the same.

15. A micromechanical device, comprising:
    a microelectronic substrate; and
    a tiltable body on the microelectronic substrate, the tiltable body including an optical device region configured to tilt about an axis over an angular range defined by contact of an axially displaced tilt stop engaging portion of the tiltable body with a tilt stop on the substrate, wherein the tilt stop engaging portion is displaced from the optical device region along the axis.

16. The apparatus of claim 15, wherein the axis is substantially parallel to the microelectronic substrate.

17. The apparatus of claim 15, wherein the optical device region comprises at least one of a mirror, a lens, a prism and an optical source.

18. The apparatus of claim 15, wherein the microelectronic substrate has an opening therein configured to receive a portion of the tiltable body as it tilts about the axis.

19. The apparatus of claim 18, wherein the tilt stop comprises a surface of the microelectronic substrate adjacent the opening.

20. The apparatus of claim 15, wherein the tiltable body is attached to the microelectronic substrate by first and second spaced apart supports.

21. The apparatus of claim 20, wherein the tiltable body further comprises first and second beams attached to respective ones of the first and second supports.

22. The apparatus of claim 15, further comprising an actuator operative to tilt the tiltable body about the axis.

* * * * *